(12) United States Patent
Goshonoo

(10) Patent No.: US 11,489,008 B2
(45) Date of Patent: Nov. 1, 2022

(54) LIGHT-EMITTING DEVICE

(71) Applicant: TOYODA GOSEI CO., LTD., Kiyosu (JP)

(72) Inventor: Koichi Goshonoo, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 17/586,418

(22) Filed: Jan. 27, 2022

(65) Prior Publication Data

US 2022/0271083 A1 Aug. 25, 2022

(30) Foreign Application Priority Data

Feb. 23, 2021 (JP) .............................. JP2021-026892
Mar. 15, 2021 (JP) .............................. JP2021-041226

(51) Int. Cl.
| | | |
|---|---|---|
| *H01L 27/15* | (2006.01) | |
| *G09G 3/32* | (2016.01) | |
| *H01L 25/18* | (2006.01) | |
| *H01L 23/00* | (2006.01) | |

(52) U.S. Cl.
CPC ............ *H01L 27/156* (2013.01); *G09G 3/32* (2013.01); *G09G 2300/0408* (2013.01); *G09G 2300/0426* (2013.01); *G09G 2310/0221* (2013.01); *G09G 2310/0267* (2013.01); *G09G 2310/08* (2013.01); *H01L 24/05* (2013.01); *H01L 24/08* (2013.01); *H01L 25/18* (2013.01); *H01L 2224/05547* (2013.01); *H01L 2224/08148* (2013.01)

(58) Field of Classification Search
None
See application file for complete search history.

(56) References Cited

U.S. PATENT DOCUMENTS

| | | | |
|---|---|---|---|
| 2018/0019233 A1 | 1/2018 | Chang et al. | |
| 2018/0331085 A1 | 11/2018 | Chang et al. | |
| 2018/0331086 A1 | 11/2018 | Chang et al. | |
| 2021/0005672 A1* | 1/2021 | Lee ..................... | H01L 27/322 |
| 2021/0384271 A1* | 12/2021 | Ahn .................... | H01L 51/0031 |
| 2022/0005796 A1* | 1/2022 | Jang .................... | H01L 27/124 |

FOREIGN PATENT DOCUMENTS

| | | |
|---|---|---|
| JP | 6131374 B1 | 5/2017 |
| JP | 2018-014475 A | 1/2018 |
| JP | 2019-152851 A | 9/2019 |
| JP | 2019-207293 A | 12/2019 |
| JP | 2020-119967 A | 8/2020 |
| WO | WO 2018/016728 A1 | 1/2018 |

* cited by examiner

*Primary Examiner* — Christopher J Kohlman
(74) *Attorney, Agent, or Firm* — McGinn IP Law Group, PLLC

(57) ABSTRACT

A first light emission region includes an n-type contact layer, a first light-emitting layer, a p-type contact layer, and a wavelength conversion layer. The second light emission region includes an n-type contact layer, a first light-emitting layer, a first intermediate layer, a second light-emitting layer, and a p-type contact layer. The third light emission region includes an n-type contact layer, a first light-emitting layer, a first intermediate layer, a second light-emitting layer, a second intermediate layer, a third light-emitting layer, and a p-type contact layer. The wavelength conversion layer is disposed between the p-type contact layer of the first light emission region and the driving circuit substrate.

15 Claims, 15 Drawing Sheets

LIGHT-EMITTING DEVICE

BACKGROUND OF THE INVENTION

Field of the Invention

The present invention relates to a light-emitting device. More specifically, the present invention relates to a micro-LED device characterized in a driving method.

Background Art

Some display devices include a micro-LED element. A wavelength conversion part may be used to convert light emitted by the micro-LED element into other color as required. Thus, a display device emitting three colors of lights: red, green, and blue at each part of the display device, has been developed.

For example, Patent Document 1 discloses a display device having a region emitting red light, a region emitting green light, and a region emitting blue light on a driving circuit substrate. A micro-LED element 100 emits blue light. A red wavelength conversion part 22 is disposed at the region emitting red light, and a green wavelength conversion part 23 is disposed at the region emitting green light (paragraph [0021] of Patent Document 1). The red wavelength conversion part 22 converts blue light into red light. The green wavelength conversion part 23 converts blue light into green light.

Recently, the demand for high-resolution display is increasing, and a micro-LED display is attracting attention (Patent Documents 2 to 4). The micro-LED display is a display in which micro-LEDs having the order of 1 μm to 100 μm are arranged in a matrix. Patent Document 2 discloses that micro-LEDs are individual chips. Patent Documents 3 and 4 discloses a monolithic micro-LED display having a plurality of micro-LEDs formed on one substrate. Monolithic micro-LED display is superior in miniaturization.

A driving method of the micro-LED display includes passive matrix and active matrix.

Patent Document 1: Japanese Patent Application Laid-Open (kokai) No. 2019-152851
Patent Document 2: Japanese Patent Application Laid-Open (kokai) No. 2019-207293
Patent Document 3: Japanese Patent Application Laid-Open (kokai) No. 2018-14475
Patent Document 4: Japanese Patent Application Laid-Open (kokai) No. 2020-119967

In Patent Document 1, an nitride semiconductor layer 14 is grown on a growth substrate 9, the growth substrate 9 is bonded to a driving circuit substrate 50 (paragraph [0031] of Patent Document 1). Then, the growth substrate 9 is peeled off (paragraph [0032] of Patent Document 1). After this, the red wavelength conversion part 22 and the green wavelength conversion part 23 are formed.

As mentioned above, in Patent Document 1, the growth substrate must be peeled off. Patent Document 1 discloses a technique to peel off the growth substrate by combining grinding, polishing, plasma etching, wet etching, and others (paragraph [0032] of Patent Document 1). However, when a plurality of the above steps is performed, a method for producing a display device becomes complicated, and the cycle time becomes longer. Moreover, when the growth substrate is peeled off, the semiconductor layer may be damaged. Therefore, a light-emitting device in which the growth substrate is not peeled off, is preferably produced.

However, when the growth substrate is not peeled off, a distance between the wavelength conversion part and the semiconductor layer becomes longer in Patent Document 1. When the distance is longer, light before wavelength conversion may leak into adjacent subpixels. Thereby, a light image may be blurred.

In the passive matrix driving method, a display is driven by sequentially scanning one line by one line. As the number of lines is increased, the emission time of each line is reduced, and brightening is difficult. Moreover, an n-electrode must be formed for each subpixel, and the micro-LED display was difficult to miniaturize. Therefore, usually, the micro-LED display was driven by the active matrix driving method.

On the other hand, the active matrix driving method requires a circuit holding the brightness information for each subpixel and a circuit driving the display based on the information. There was a problem that the structure is more complicated than that of the passive matrix driving method. In the active matrix driving method, there was also a problem that color is changed when brightness for each subpixel is controlled by the magnitude of current. This is because the emission wavelength of LED depends on the magnitude of current. The brightness for each subpixel may be controlled by PWM to prevent the emission wavelength from changing. However, the size of PWM circuit is large, and the size of subpixel cannot be reduced.

Thus, the conventional passive matrix or active matrix driving method was not appropriate for driving a monolithic micro-LED display.

SUMMARY OF THE INVENTION

An object of the present invention relating to a light-emitting device is to include a driving circuit substrate and a growth substrate, and suppress adverse effects due to a longer distance between a wavelength conversion part and a semiconductor layer. An object of the present invention relating to a driving method is to achieve more appropriate driving of a monolithic micro-LED display.

In a first aspect of the present invention, there is a provided a light-emitting device including a driving circuit substrate, a transparent substrate, a semiconductor layer between the driving circuit substrate and the transparent substrate, a first light emission region, a second light emission region, a third light emission region, and a wavelength conversion layer. The transparent substrate has a first surface and a second surface opposite to the first surface. The first surface of the transparent substrate faces the semiconductor layer. A light extraction surface is on the second surface side of the transparent substrate. The semiconductor layer has an n-type semiconductor layer, a first light-emitting layer, a first intermediate layer, a second light-emitting layer, a second intermediate layer, a third light-emitting layer, and a p-type semiconductor layer. The first light emission region has the n-type semiconductor layer, the first light-emitting layer, the p-type semiconductor layer, and the wavelength conversion layer. The second light emission region has the n-type semiconductor layer, the first light-emitting layer, the first intermediate layer, the second light-emitting layer, and the p-type semiconductor layer. The third light emission region has the n-type semiconductor layer, the first light-emitting layer, the first intermediate layer, the second light-emitting layer, the second intermediate layer, the third light-emitting layer, and the p-type semiconductor layer. A band gap of a well layer of the third light-emitting layer is smaller than a band gap of a well layer of the second light-emitting layer.

A band gap of a well layer of the second light-emitting layer is smaller than a band gap of a well layer of the first light-emitting layer. The wavelength conversion layer is disposed between the p-type semiconductor layer of the first light emission region and the driving circuit substrate.

The light-emitting device includes a driving circuit substrate and a transparent substrate as a growth substrate. A growth substrate does not exist between the wavelength conversion layer and the semiconductor layer. A distance between the wavelength conversion layer and the semiconductor layer is sufficiently close. Therefore, even if the transparent substrate remains without being removed, a light image is hardly blurred.

In the light-emitting device according to the first aspect of the invention, the wavelength conversion layer may not be disposed between the p-type semiconductor layer of the second light emission region and the driving circuit substrate, and between the p-type semiconductor layer of the third light emission region and the driving circuit substrate.

The light-emitting device may include a transparent electrode in contact with the p-type semiconductor layer. The wavelength conversion layer may be in contact with the transparent electrode of the first light emission region.

The light-emitting device may include a transparent electrode in contact with the p-type semiconductor layer, and a p-type contact electrode in contact with the transparent electrode. The wavelength conversion layer is preferably in contact with the p-type contact electrode of the first light emission region.

The light-emitting device preferably has a light-absorbing layer absorbing light having a wavelength corresponding to the emission wavelength of the first light-emitting layer between the n-type semiconductor layer and the transparent substrate.

The light-emitting device may include a light-absorbing layer absorbing light having a wavelength corresponding to the emission wavelength of the first light-emitting layer on the second surface side of the transparent substrate.

The light-absorbing layer is preferably formed over the first light emission region, the second light emission region, and the third light emission region.

The light-absorbing layer is preferably semiconductor.

The wavelength conversion layer is preferably a layer converting ultraviolet light into red light.

The wavelength conversion layer is preferably semiconductor.

A reflective layer is preferably formed between the wavelength conversion layer and the driving circuit substrate.

In a second aspect of the present invention, there is a provided a micro-LED display having a monolithic micro-LED display element in which a plurality of light-emitting parts is arranged in a matrix and a driving device driving the micro-LED display element, wherein the light-emitting part is divided into a plurality of regions, and each region is independently driven by the driving device. The driving device has a scan line circuit sequentially selecting and scanning one line by one line being light emitted of the light-emitting part in each region, a transistor provided for each light emitting part to control so that the line selected by the scan line circuit is turned on to flow a current to the light emitting part, and the line not selected by the scan line circuit is turned off to prevent a current from flowing to the light emitting part, and a PWM circuit provided for each raw of the light emitting part in each region to control the duty ratio by pulse modulating the current flowing to the light emitting part.

In the micro-LED display according to the second aspect of the invention, the micro-LED display element may have a p-electrode formed for each light-emitting part, and an n-electrode commonly formed among the light-emitting parts.

Each region may be divided so that the number of lines is 10 to 100.

The micro-LED display element and the driving device are mounted on a mounting substrate, and the driving device may be mounted below the micro-LED display element.

The light-emitting device according to the first aspect of the invention includes a driving circuit substrate and a growth substrate, and suppresses blur of a light image due to a longer distance between the wavelength conversion part and the semiconductor layer.

In the micro-LED display according to the second aspect of the invention, the micro-LED display is driven by dividing into a plurality of regions, thereby suppressing the reduction of the emission time for each line. Each region is driven by the active matrix driving method. Therefore, an n-electrode of the micro-LED display does not need to be formed for each subpixel, and can be commonly formed, thereby miniaturizing the micro-LED display.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
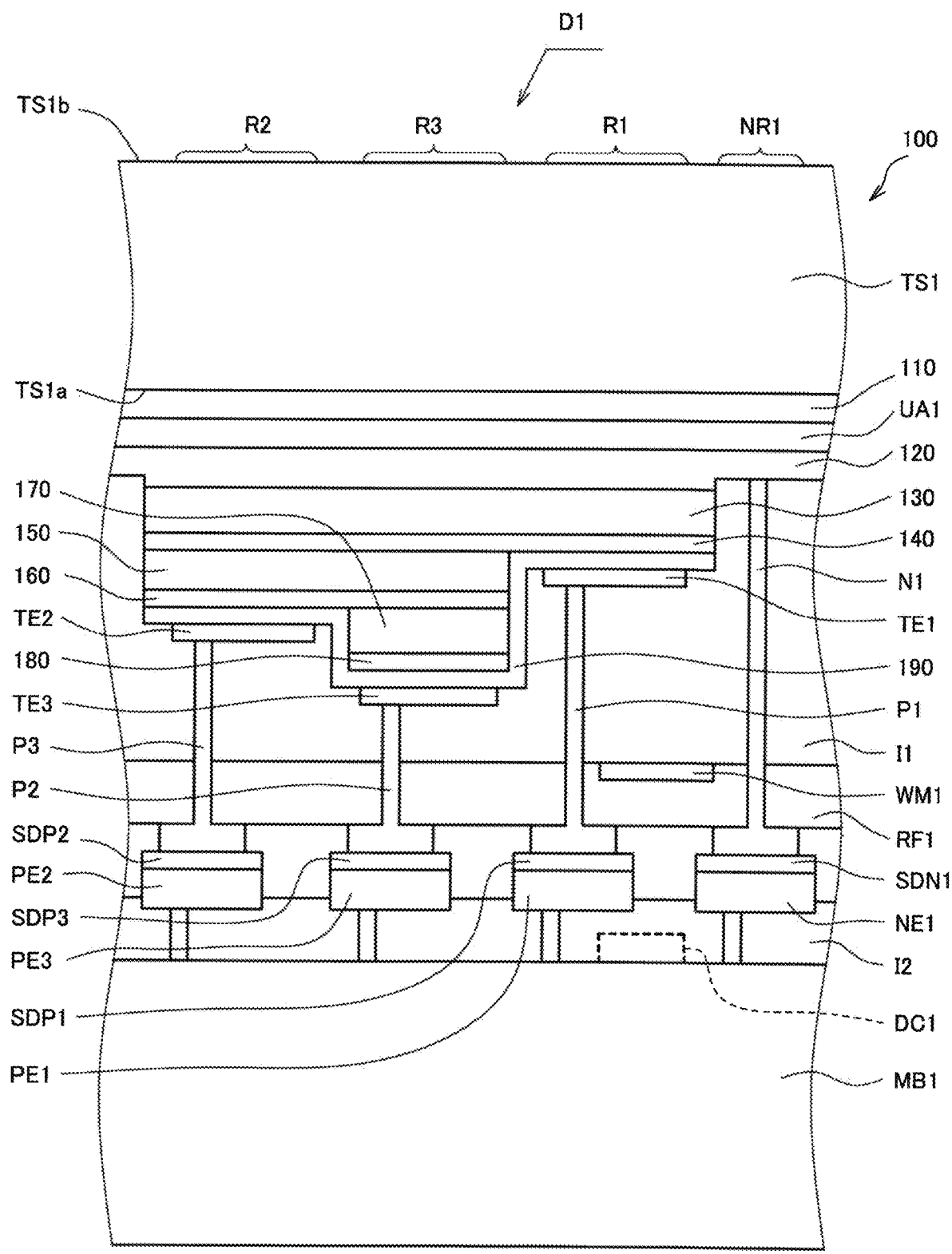
FIG. 1 is a schematic view of the structure of a light-emitting device D1 according to a first embodiment.

With reference to the drawings, specific embodiments of the light-emitting device as examples will next be described in detail. However, these embodiments should not be construed as limiting the techniques thereto. The below-described depositing structure of the layers of the light-emitting device and the electrode structure are given only for the illustration purpose, and other depositing structures differing therefrom may also be employed. The thickness of each of the layers shown in the drawings is not an actual value, but a conceptual value.

First Embodiment

1. Light-Emitting Device

FIG. 1 is a schematic view of the structure of a light-emitting device D1 according to a first embodiment. The light-emitting device D1 includes a plurality of Group III nitride semiconductor layers. As shown in FIG. 1, the light-emitting device D1 includes a transparent substrate TS1, a base layer 110, a light-absorbing layer UA1, an n-type contact layer 120, a first light-emitting layer 130, a first intermediate layer 140, a second light-emitting layer 150, a second intermediate layer 160, a third light-emitting layer 170, a cap layer 180, a p-type contact layer 190, transparent electrodes TE1, TE2, and TE3, an n-type contact electrode N1, p-type contact electrodes P1, P2, and P3, solder layers SDN1, SDP1, SDP2, and SDP3, an n-electrode NE1, p-electrodes PE1, PE2, and PE3, a wavelength conversion layer WM1, a reflective layer RF1, insulating layers I1, and I2, and a driving circuit substrate MB1.

On a first surface TS1a of the transparent substrate TS1, the base layer 110, the light-absorbing layer UA1, an n-type contact layer 120, the first light-emitting layer 130, the first intermediate layer 140, the second light-emitting layer 150, the second intermediate layer 160, the third light-emitting layer 170, the cap layer 180, and the p-type contact layer 190 are formed in this order. These semiconductor layers are disposed between the driving circuit substrate MB1 and the transparent substrate TS1. The n-type contact electrode N1 is formed on the n-type contact layer 120. The p-type contact electrodes P1, P2, and P3 are formed on the transparent electrodes TE1, TE2, and TE3, respectively.

The n-type contact layer 120 is an n-type semiconductor layer. The p-type contact layer 190 is a p-type semiconductor layer. The first light-emitting layer 130, the first intermediate layer 140, the second light-emitting layer 150, the second intermediate layer 160, and the third light-emitting layer 170 are an undoped semiconductor layer. The base layer 110 and the cap layer 180 are an n-type semiconductor layer and an undoped semiconductor layer, respectively. Hereinafter, "undoped semiconductor layer" refers to an intentionally undoped semiconductor layer.

The transparent substrate TS1 is a growth substrate for growing a semiconductor layer. The transparent substrate TS1 has a first surface TS1a and a second surface TS1b. The second surface TS1b is a surface opposite to the first surface TS1a. The first surface TS1a is a surface for growing a semiconductor layer. Therefore, the first surface TS1a faces the semiconductor layer. The second surface TS1b is a light extraction surface. The first surface TS1a of the transparent substrate TS1 is, for example, a c-plane. The transparent substrate TS1 is, for example, a different type substrate such as sapphire substrate and AlN substrate. The transparent substrate TS1 may be a GaN substrate.

The base layer 110 is a semiconductor layer formed on the first surface TS1a of the transparent substrate TS1. A buffer layer is preferably formed between the transparent substrate TS1 and the base layer 110.

The light-absorbing layer UA1 absorbs light having a wavelength corresponding to the emission wavelength of the first light-emitting layer 130. The light-absorbing layer UA1 is formed on the base layer 110. The light-absorbing layer UA1 is disposed between the n-type contact layer 120 and the transparent substrate TS1. For example, when the first light-emitting layer 130 emits ultraviolet ray, the light-absorbing layer UA1 absorbs ultraviolet ray. The light-absorbing layer UA1 is semiconductor. The light-absorbing layer UA1 is, for example, made of GaN.

The n-type contact layer 120 is a layer in contact with the n-type contact electrode N1. The n-type contact layer 120 is formed above the first surface TS1a of the transparent substrate TS1. The n-type contact layer 120 is, for example, a Si-doped n-type GaN layer. The n-type contact layer 120 may be an n-type AlGaN layer.

The first light-emitting layer 130 is an active layer emitting light through recombination of electrons with holes. The first light-emitting layer 130 is disposed between the n-type contact layer 120 and the first intermediate layer 140. The first light-emitting layer 130 has a well layer and a barrier layer. The well layer of the first light-emitting layer 130 is, for example, a GaN layer or an AlGaN layer. The barrier layer of the first light-emitting layer 130 is, for example, an AlGaN layer. The emission wavelength of the first light-emitting layer 130 is, for example, 280 nm to 440 nm.

The first intermediate layer 140 is a layer disposed between the first light-emitting layer 130 and the second light-emitting layer 150. A band gap of the first intermediate layer 140 is larger than band gaps of the well layers of the first light-emitting layer 130, a band gap of the second light-emitting layer 150, and the third light-emitting layer 170. The first intermediate layer 140 is made of, for example, AlInGaN.

The second light-emitting layer 150 is an active layer emitting light through recombination of electrons with holes. The second light-emitting layer 150 is disposed between the first intermediate layer 140 and the second intermediate layer 160. The second light-emitting layer 150 has a well layer and a barrier layer. The well layer of the second light-emitting layer 150 is, for example, an InGaN layer. The barrier layer of the second light-emitting layer 150 is, for example, a GaN layer. The emission wavelength of the second light-emitting layer 150 is, for example, 440 nm to 490 nm.

The second intermediate layer 160 is a layer disposed between the second light-emitting layer 150 and the third light-emitting layer 170. A band gap of the second intermediate layer 160 is larger than band gaps of the well layers of the first light-emitting layer 130, the second light-emitting layer 150, and the third light-emitting layer 170. The second intermediate layer 160 is made of, for example, AlInGaN.

The third light-emitting layer 170 an active layer emitting light through recombination of electrons with holes. The third light-emitting layer 170 is disposed between the second intermediate layer 160 and the cap layer 180. The third light-emitting layer 170 has a well layer and a barrier layer. The well layer of the third light-emitting layer 170 is, for example, an InGaN layer. The barrier layer of the third light-emitting layer 170 is, for example, a GaN layer. The emission wavelength of the third light-emitting layer 170 is, for example, 490 nm to 570 nm.

The cap layer 180 is a layer disposed between the third light-emitting layer 170 and the p-type contact layer 190. A band gap of the cap layer 180 is larger than band gaps of the well layers of the first light-emitting layer 130, the second light-emitting layer 150, and the third light-emitting layer 170. The cap layer 180 is made of, for example, AlInGaN.

The p-type contact layer 190 is a p-type semiconductor layer electrically connected with the p-type contact electrode P1. The p-type contact layer 190 is in contact with the transparent electrodes TE1, TE2, and TE3. The p-type contact layer 190 is formed above the first intermediate layer 140, the second intermediate layer 160, and the cap layer 180. The p-type contact layer 190 covers the side surface of the second light-emitting layer 150, the second intermediate layer 160, the third light-emitting layer 170, and the cap layer 180. The p-type contact layer 190 covers the semiconductor layer on the first surface TS1$a$ side of the transparent substrate TS1. The p-type contact layer 190 is, for example, a Mg-doped p-type GaN layer. The p-type contact layer 190 may be a p-type AlGaN layer.

The transparent electrodes TE1, TE2, and TE3 are formed on the p-type contact layer 190. The transparent electrodes TE1, TE2, and TE3 are in contact with the p-type contact layer 190. The transparent electrodes TE1, TE2, and TE3 are made of, for example, transparent conductive oxide such as ITO, IZO, ICO, ZnO, $TiO_2$, $NbTiO_2$, and $TaTiO_2$.

The p-type contact electrodes P1, P2, and P3 are electrically connected with the p-type contact layer 190. The p-type contact electrodes P1, P2, and P3 are formed in contact with the transparent electrodes TE1, TE2, and TE3, respectively. The p-type contact electrodes P1, P2, and P3 may include a metal layer or an alloy layer such as Ni, Au, Ag, Co, and In. The p-type contact electrodes P1, P2, and P3 are formed in independent regions, respectively.

The n-type contact electrode N1 is electrically connected with the n-type contact layer 120. The n-type contact electrode N1 is formed on and in contact with the n-type contact layer 120. The n-type contact electrode N1 is made of, for example, metal such as Ni, Au, Ag, Co, In, and Ti.

The solder layers SDN1, SDP1, SDP2, and SDP3 are a junction layer joining and electrically connecting the light-emitting device 100 and the electrodes of the driving circuit substrate MB1. The solder layer SDN1 is electrically connected with the n-type contact electrode N1, and the n-electrode NE1 of the driving circuit substrate MB1. The solder layer SDP1 is electrically connected with the p-type contact electrode P1 and the p-electrode PE1 of the driving circuit substrate MB1. The solder layer SDP2 is electrically connected with the p-type contact electrode P2 and the p-electrode PE2 of the driving circuit substrate MB1. The solder layer SDP3 is electrically connected with the p-type contact electrode P3 and the p-electrode PE3 of the driving circuit substrate MB.

The n-electrode NE1 is an electrode of the driving circuit substrate MB1. The n-electrode NE1 is electrically connected with the n-type contact electrode N1.

The p-electrodes PE1, PE2, and PE3 are electrodes of the driving circuit substrate MB1. The p-electrodes PE1, PE2, and PE3 are electrically connected with the p-type contact electrodes P1, P2, and P3 respectively via the solder layers SDP1, SDP2, and SDP3.

The wavelength conversion layer WM1 is a layer converting the wavelength of light emitted from the first light-emitting layer 130. For example, when the first light-emitting layer 130 emits ultraviolet ray, the wavelength conversion layer WM1 absorbs ultraviolet ray, and emits red light. The wavelength conversion layer WM1 is disposed between the p-type contact layer 190 of the first light emission region R1 and the driving circuit substrate MB1. The wavelength conversion layer WM1 is disposed in a contact state between the insulating layer I1 and the reflective layer RF1. The wavelength conversion layer WM1 is disposed in the first light emission region R1, but is not disposed in the second light emission region R2 and the third light emission region R3. That is, the wavelength conversion layer WM1 is not disposed between the p-type contact layer 190 of the second light emission region R2 and the driving circuit substrate MB1, and between the p-type contact layer 190 of the third light emission region R3 and the driving circuit substrate MB1.

The reflective layer RF1 is a reflective film reflecting light directed from the first light-emitting layer 130, the second light-emitting layer 150, and the third light-emitting layer 170 toward the driving circuit substrate MB1. The reflective layer RF1 also exists between the driving circuit substrate MB1 and the wavelength conversion layer WM1. The reflective layer RF1 may be a metal layer or a DBR film.

The insulating layer I1 is a layer covering the surface of the semiconductor layer and insulating the n-type contact electrode N1, the p-type contact electrodes P1, P2, and P3. The insulating layer I1 is disposed between the wavelength conversion layer WM1 or the reflective layer RF1, and the transparent electrodes TE1, TE2, and TE3. The insulating layer I1 is made of, for example, $SiO_2$.

The insulating layer I2 is a layer covering the surface of the driving circuit substrate MB1. The insulating layer 12 mutually insulates the n-electrode NE1, and p-electrode PE1, PE2, and PE3.

The driving circuit substrate MB1 is a substrate for mounting a light-emitting device 100 thereon. The driving circuit substrate MB1 has a driving circuit DC1. The driving circuit DC1 is a circuit individually emitting each of subpixels of the light-emitting device 100.

The n-type contact layer 120 is formed over the first light emission region R1, the second light emission region R2, and the third light emission region R3. The light-emitting device D1 has one n-type contact electrode N1 on the n-type contact layer 120. On the other hand, the light-emitting device D1 has one set of the p-type contact electrodes P1, P2, and P3 for each subpixel.

The film thickness of the n-type contact layer 120 is, for example, 1 μm to 5 μm. The film thickness of the first light-emitting layer 130, the second light-emitting layer 150, and the third light-emitting layer 170 is, for example, 6 nm to 100 nm. The film thickness of the first intermediate layer 140, and the second intermediate layer 160 is, for example, 2 nm to 100 nm. The film thickness of the cap layer 180 is, for example, 5 nm to 10 nm. The film thickness of the p-type contact layer 190 is, for example, 10 nm to 200 nm.

2. Band Structure and Behavior of Electrons and Holes 2-1. Band Structure

Figure 2:
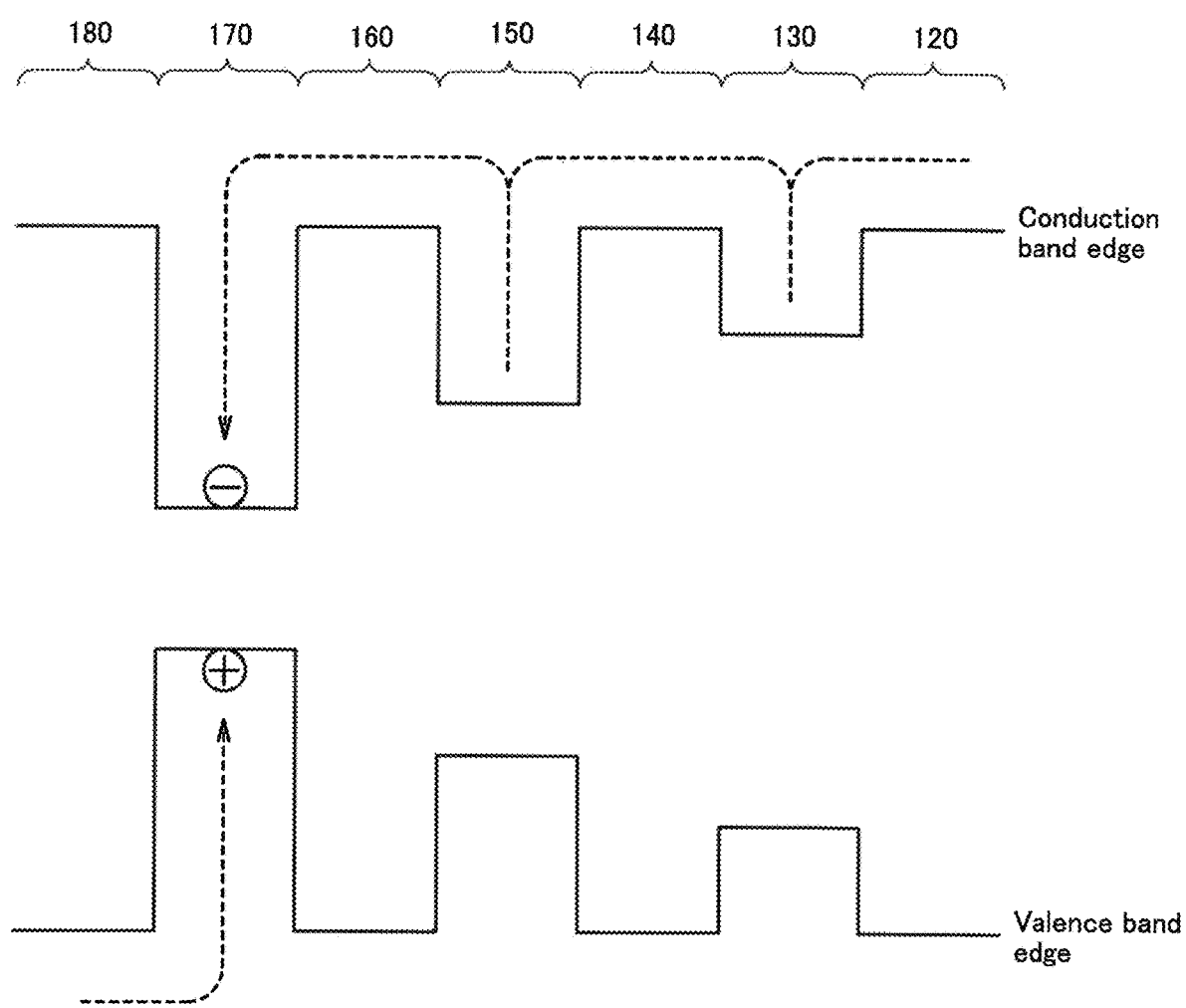
FIG. 2 is a schematic view of band structure and behavior of electrons and holes in the light-emitting device D1 according to the first embodiment.

FIG. 2 is a schematic view of band structure and behavior of electrons and holes in the third region R3 of the light-emitting device D1 according to the first embodiment. In FIG. 2, for easier explanation, each light-emitting layer is drawn as having a single quantum well structure. Each light-emitting layer may have a multi-quantum well structure.

As shown in FIG. 2, a band gap of the well layer of the third light-emitting layer 170 is smaller than a band gap of the well layer of the second light-emitting layer 150. A band gap of the well layer of the second light-emitting layer 150 is smaller than a band gap of the well layer of the first light-emitting layer 130. A band gap of the well layer of the first light-emitting layer 130 is smaller than a band gap of a layer such as a barrier layer. Therefore, the first light-emitting layer 130, the second light-emitting layer 150, and the third light-emitting layer 170 have different emission wavelength.

2-2. Behavior of Electrons and Holes

Holes supplied from the p-type contact electrode p2 are easily injected into the third light-emitting layer 170. Holes remain in the third light-emitting layer 170 without moving out from the third light-emitting layer 170. This is because the valence band of the third light-emitting layer 170 has sufficiently high barrier for the valence band of second intermediate layer 160.

Electrons supplied from the n-type contact electrode N1 are injected into the first light-emitting layer 130. The conduction band of the first light-emitting layer 130 has a low barrier for the conduction band of the first intermediate layer 140. Therefore, electrons easily move from the first light-emitting layer 130 to the second light-emitting layer 150. The conduction band of the second light-emitting layer 150 has a low barrier for the conduction band of the second intermediate layer 160. Therefore, electrons easily move from the second light-emitting layer 150 to the third light-emitting layer 170. Electrons moved into the third light-emitting layer 170 remain in the third light-emitting layer 170 without moving out therefrom. The conduction band of the third light-emitting layer 170 has a sufficiently high barrier for the conduction band of the cap layer.

Thus, electrons easily exist in the third light-emitting layer 170, and holes easily exist in the third light-emitting layer 170. That is, wave functions of electrons and wave functions of holes have large amplitude and are overlapped each other at the third light-emitting layer 170. Therefore, light is emitted intensively from the third light-emitting layer 170, not so much light is emitted from the first light-emitting layer 130 and the second light-emitting layer 150.

Because the third light-emitting layer 170 does not exist in the second region R2, light is emitted intensively from the second light-emitting layer 150 in which more holes exist, not so much light is emitted from the first light-emitting layer 130.

3. Light-Emitting Region

The light-emitting device D1 includes a first light emission region R1, a second light emission region R2, a third light emission region R3, and an n-electrode region NR1. The first light emission region R1, the second light emission region R2, the third light emission region R3, and the n-electrode region NR1 are disposed side by side on the first surface TS1*a* of the transparent substrate TS1. Each of the first light emission region R1, the second light emission region R2, and the third light emission region R3 correspond to a subpixel.

The first light emission region R1 emits, for example, red light. The first light emission region R1 has a base layer 110, a light-absorbing layer UA1, an n-type contact layer 120, a first light-emitting layer 130, a first intermediate layer 140, a p-type contact layer 190, a wavelength conversion layer WM1, and a reflective layer RF1. In the first light emission region R1, the p-type contact layer 190 is formed on the first intermediate layer 140.

The first light emission region R1 may not have a first intermediate layer 140. In that case, the p-type contact layer 190 of the first light emission region R1 is formed on the first light-emitting layer 130.

In the first light emission region R1, ultraviolet ray emitted from the first light-emitting layer is converted to red light by the wavelength conversion layer WM1. Red light is reflected by the reflective layer RF1, and emitted from the second surface TS1*b* of the transparent substrate TS1.

The second light emission region R2 emits, for example, blue light. The second light emission region R2 has a base layer 110, a light-absorbing layer UA1, an n-type contact layer 120, a first light-emitting layer 130, a first intermediate layer 140, a second light-emitting layer 150, a second intermediate layer 160, a p-type contact layer 190, and a reflective layer RF1. In the second light emission region R2, the p-type contact layer 190 is formed on the second intermediate layer 160.

The second light emission region R2 may not have a second intermediate layer 160. In that case, the p-type contact layer 190 of the second light emission region R2 is formed on the second light-emitting layer 150.

The third light emission region R3 emits, for example, green light. The third light emission region R3 has a base layer 110, a light-absorbing layer UA1, an n-type contact layer 120, a first light-emitting layer 130, a first intermediate layer 140, a second light-emitting layer 150, a second intermediate layer 160, a third light-emitting layer 170, a cap layer 180, a p-type contact layer 190, and a reflective layer RF1. In the third light emission region R3, the p-type contact layer 190 is formed on the cap layer 180.

The third light emission region R3 may not have a cap layer 180. In that case, the p-type contact layer 190 of the third light emission region R3 is formed on the third light-emitting layer 170.

The p-type contact layer 190 is a continuous layer. The p-type contact layer 190 is formed so as to be connected over the first light emission region R1, the second light emission region R2 and the third light emission region R3. In the first light emission region R1, the p-type contact layer 190 is in contact with the first light-emitting layer 130 or the first intermediate layer 140. In the second light emission region R2, the p-type contact layer 190 is in contact with the second light-emitting layer 150 or the second intermediate layer 160. In the third light emission region R3, the p-type contact layer 190 is in contact with the third light-emitting layer 170 or the cap layer 180.

The light-absorbing layer UA1 is formed over the first light emission region R1, the second light emission region R2, and the third light emission region. Therefore, ultraviolet ray emitted from the first light-emitting layer 130 is absorbed by the light-absorbing layer UA1.

Figure 3:
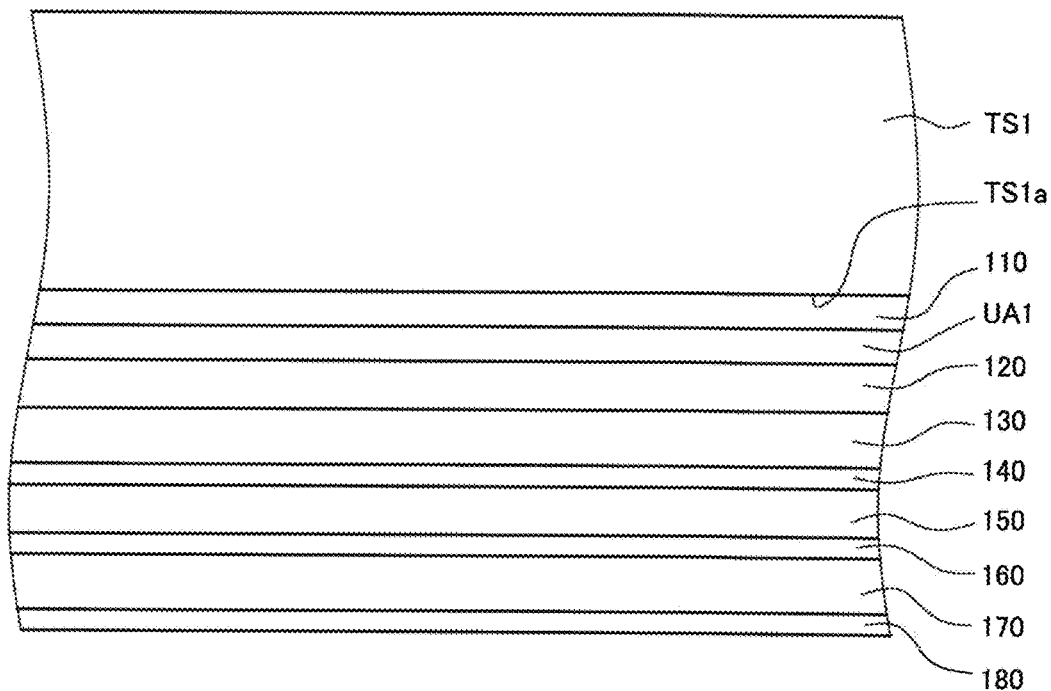
FIG. 3 is a view (part 1) explaining a method for producing the light-emitting device D1 according to the first embodiment.

4. Method for Producing Semiconductor Light-Emitting Device 4-1. Forming Semiconductor Layer As shown in FIG. 3, a semiconductor layer is epitaxially grown on the first surface TS1a of the transparent substrate TS1. In the growth of the semiconductor layer, a vapor phase growth method such as MOCVD may be employed. On the first surface TS1a of the transparent substrate TS1, a base layer 110, a light-absorbing layer UA1, an n-type contact layer 120, a first light-emitting layer 130, a first intermediate layer 140, a second light-emitting layer 150, a second intermediate layer 160, a third light-emitting layer 170, and a cap layer 180 are sequentially formed.

4-2. Forming Region

Figure 4:
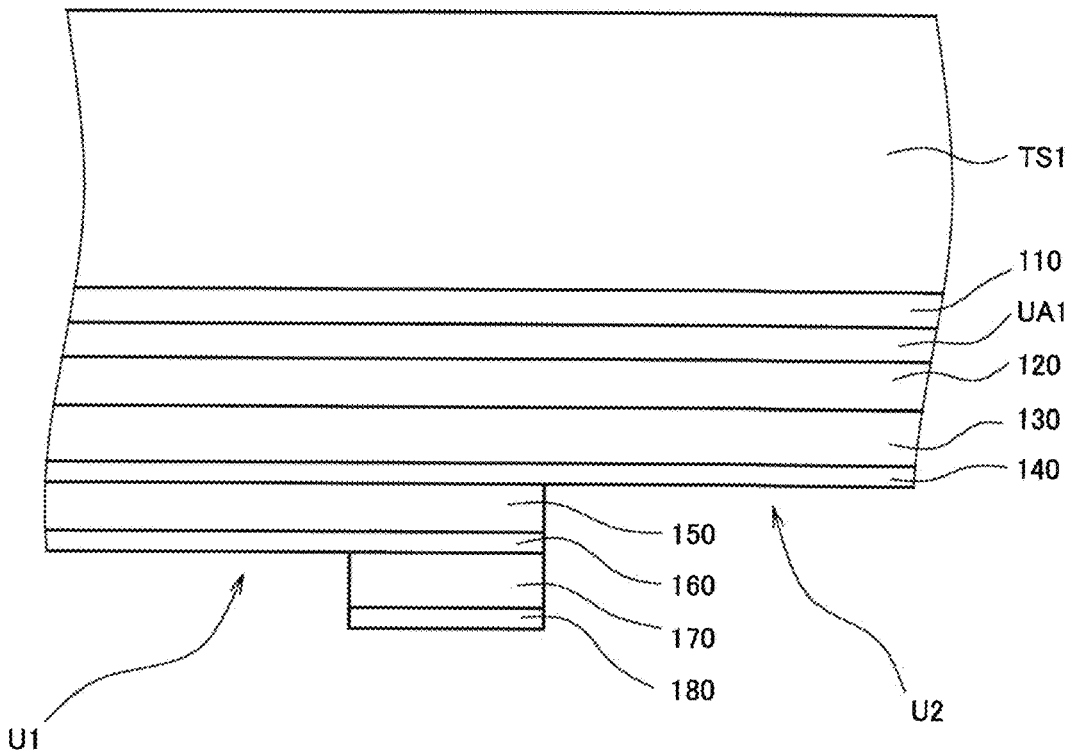
FIG. 4 is a view (part 2) explaining a method for producing the light-emitting device D1 according to the first embodiment.

As shown in FIG. 4, recesses U1 and U2 are formed in the semiconductor layers. For that, the semiconductor layers may be etched using a mask. Thus, the light-emitting region is divided into a first light emission region R1, a second light emission region R2, and a third light emission region R3.

4-3. Forming p-Type Semiconductor Layer

Figure 5:
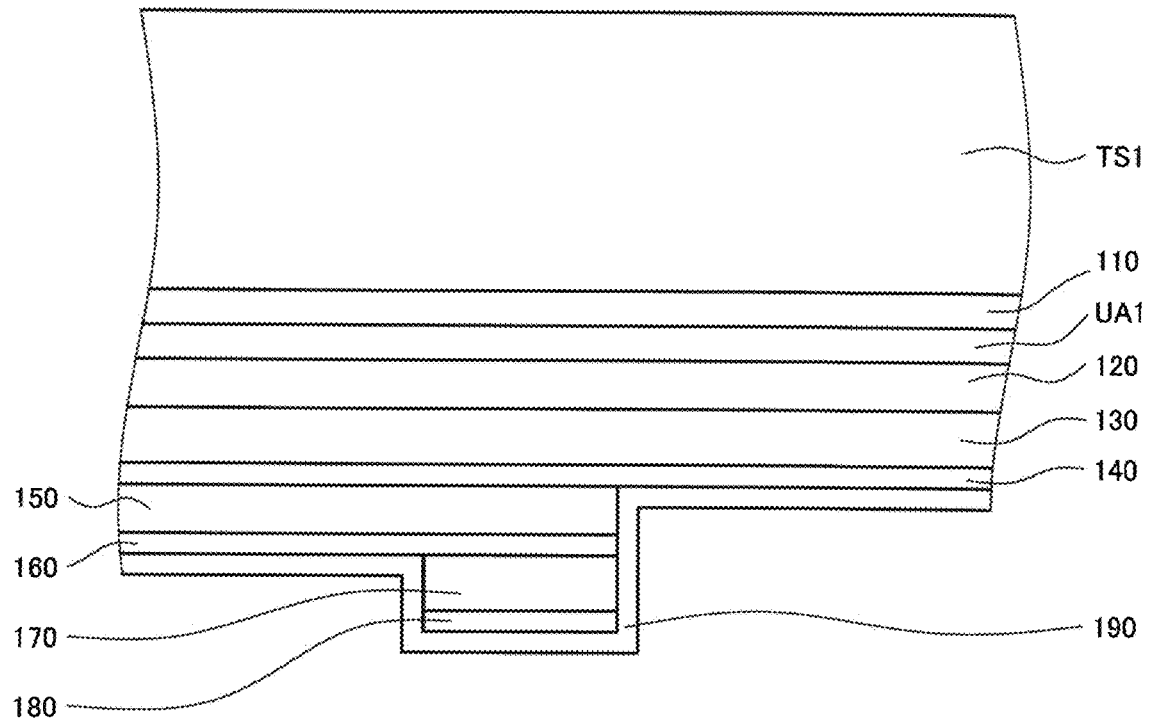
FIG. 5 is a view (part 3) explaining a method for producing the light-emitting device D1 according to the first embodiment.

As shown in FIG. 5, a p-type contact layer 190 is grown on the semiconductor layer.

4-4. Forming Transparent Electrode

Figure 6:
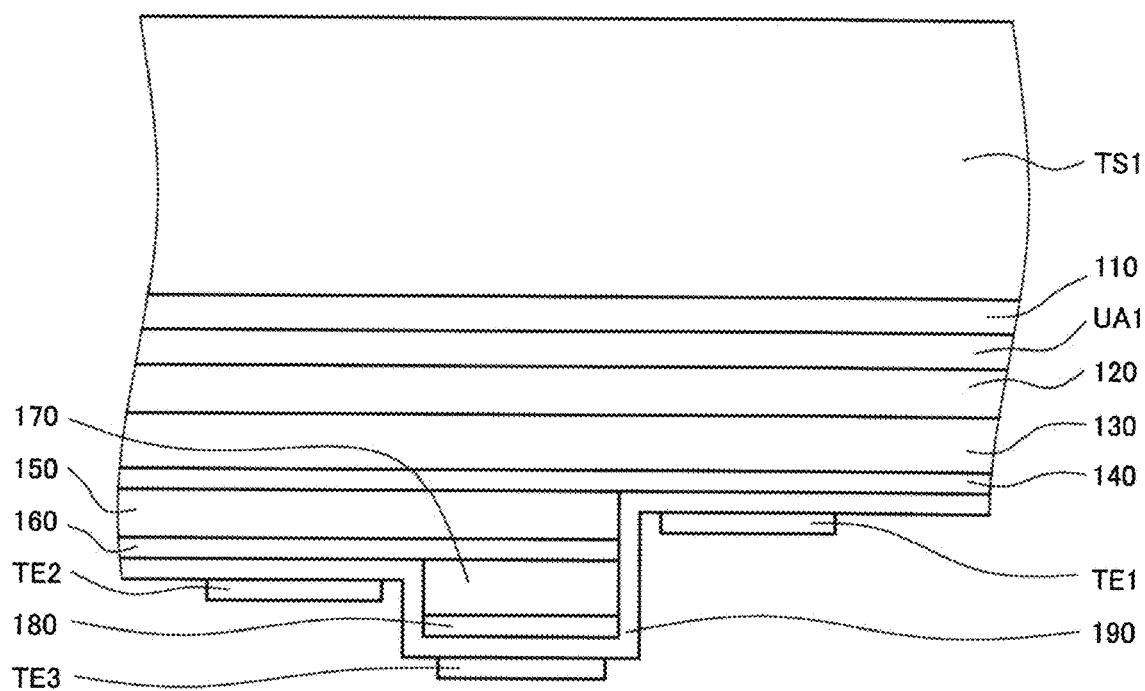
FIG. 6 is a view (part 4) explaining a method for producing the light-emitting device D1 according to the first embodiment.

As shown in FIG. 6, transparent electrodes TE1, TE2, and TE3 are formed on the p-type contact layer 190.

4-5. Forming Mesa

Figure 7:
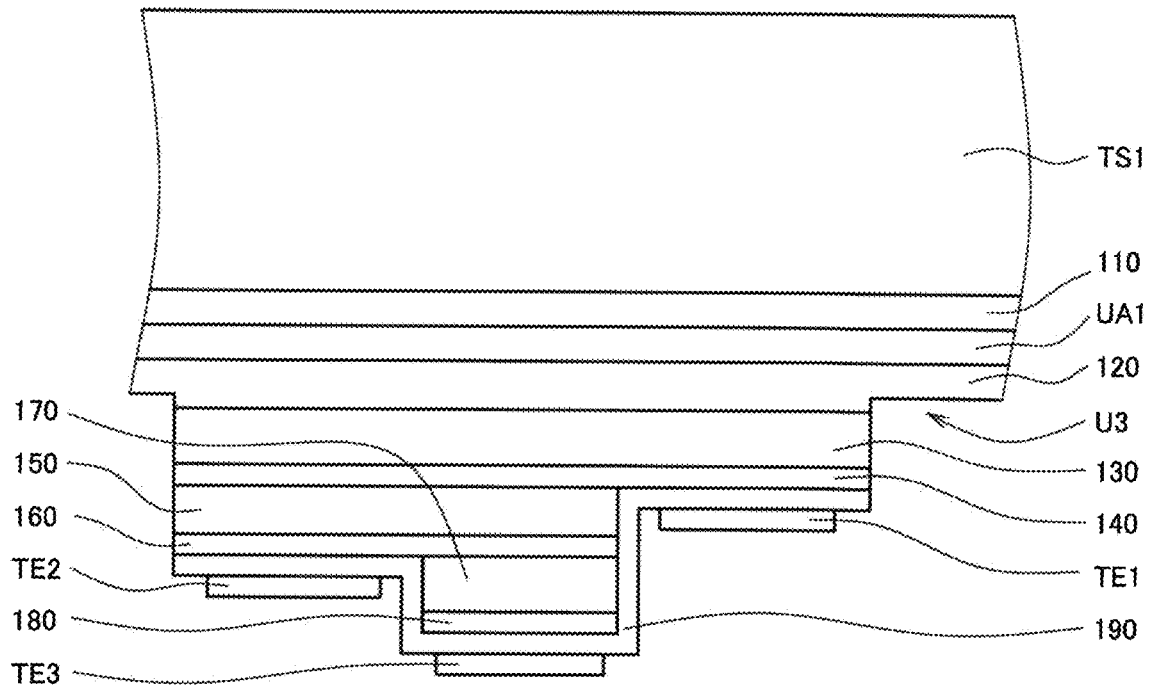
FIG. 7 is a view (part 5) explaining a method for producing the light-emitting device D1 according to the first embodiment.

As shown in FIG. 7, a recess U3 is formed. The n-type contact layer 120 is exposed in the recess U3.

4-6. Forming Insulating Layer

Figure 8:
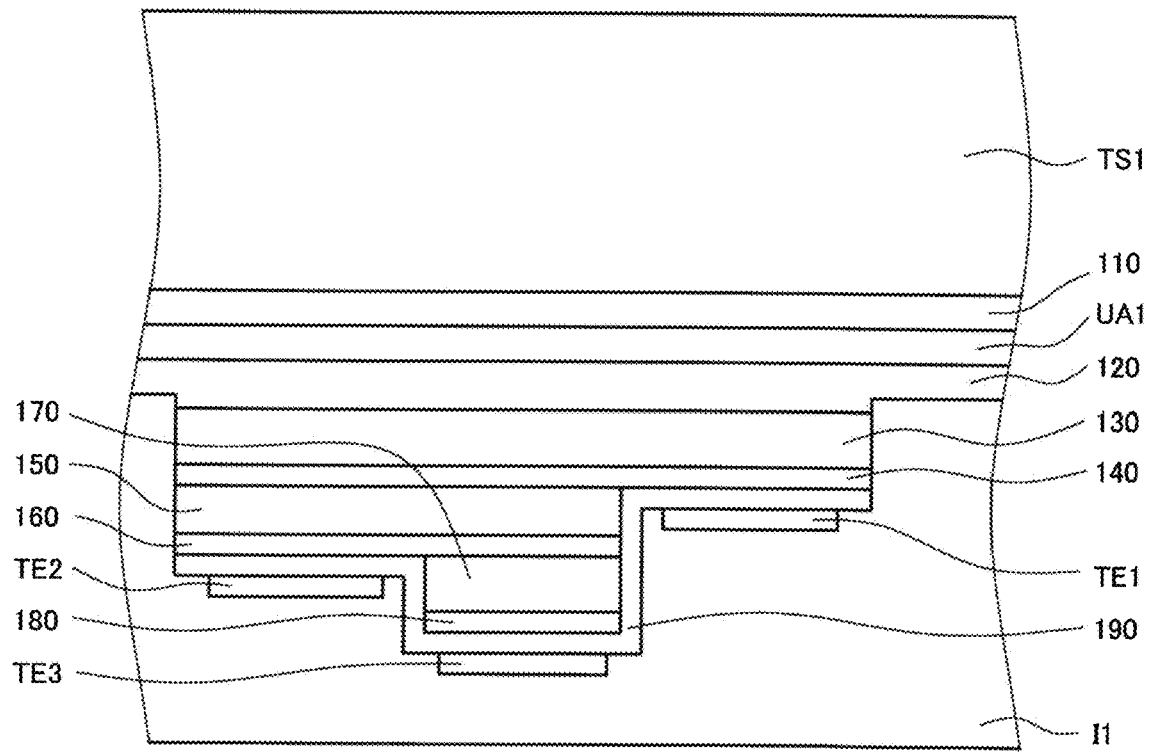
FIG. 8 is a view (part 6) explaining a method for producing the light-emitting device D1 according to the first embodiment.

As shown in FIG. 8, an insulating layer I1 is formed on the semiconductor layer and the transparent electrodes TE1, TE2, and TE3.

4-7. Adhering Wavelength Conversion Layer

Figure 9:
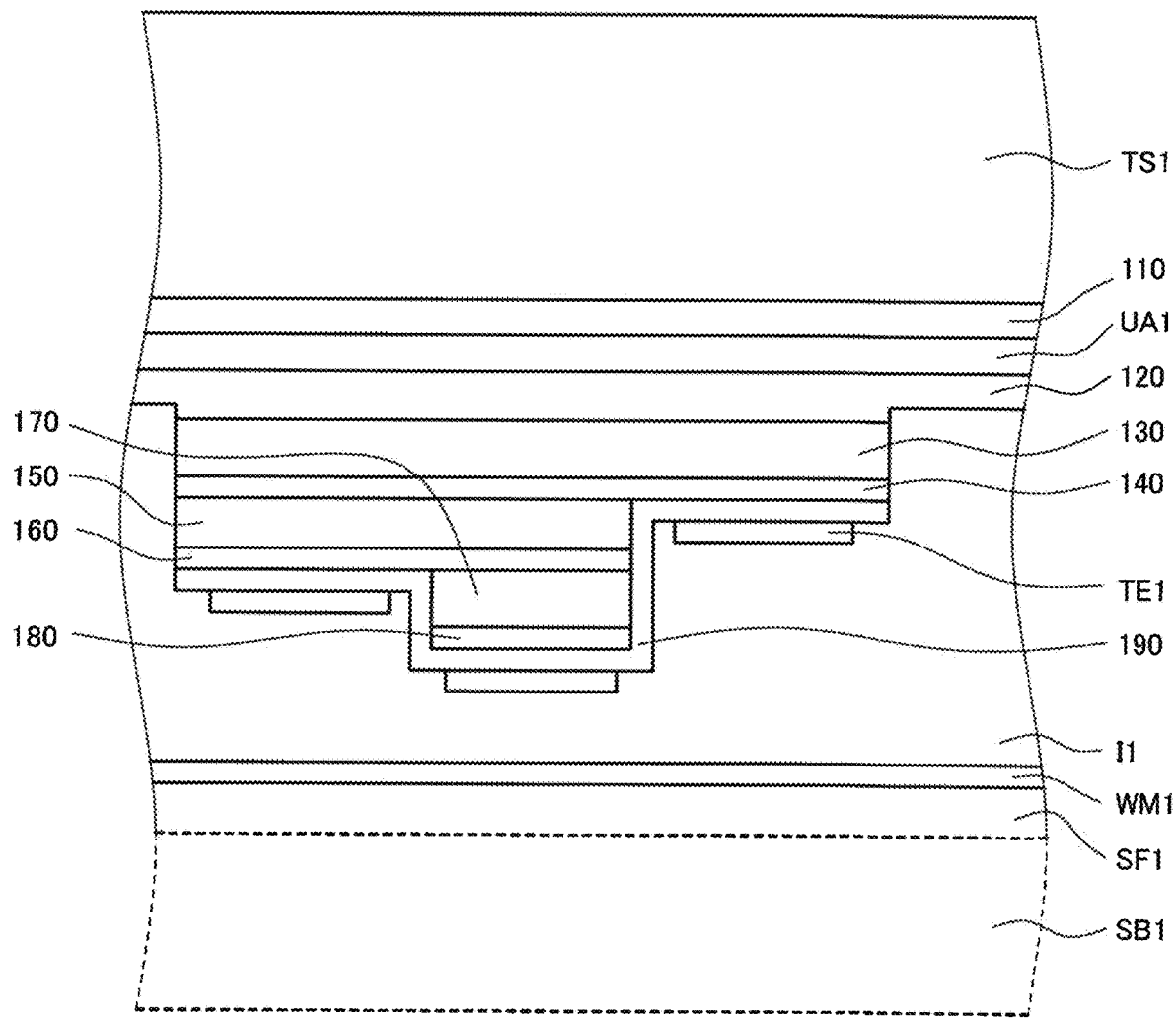
FIG. 9 is a view (part 7) explaining a method for producing the light-emitting device D1 according to the first embodiment.

As shown in FIG. 9, a substrate SB1 having a wavelength conversion layer WM1 formed over an entire surface thereof is adhered to the insulating layer I1. The substrate SB1 has a sacrificial layer SF1 and the wavelength conversion layer WM1.

4-8. Removing Substrate

Figure 10:
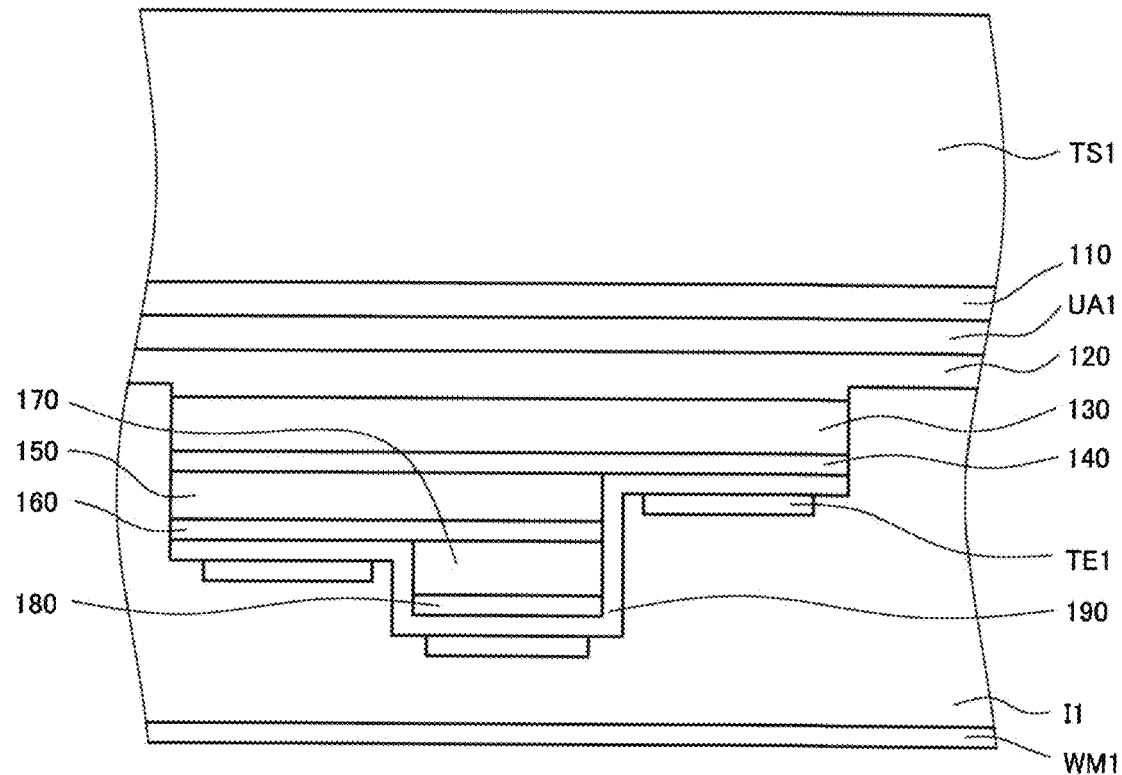
FIG. 10 is a view (part 8) explaining a method for producing the light-emitting device D1 according to the first embodiment.

As shown in FIG. 10, the substrate SB1 is removed from the wavelength conversion layer WM1.

4-9. Forming Wavelength Conversion Layer

Figure 11:
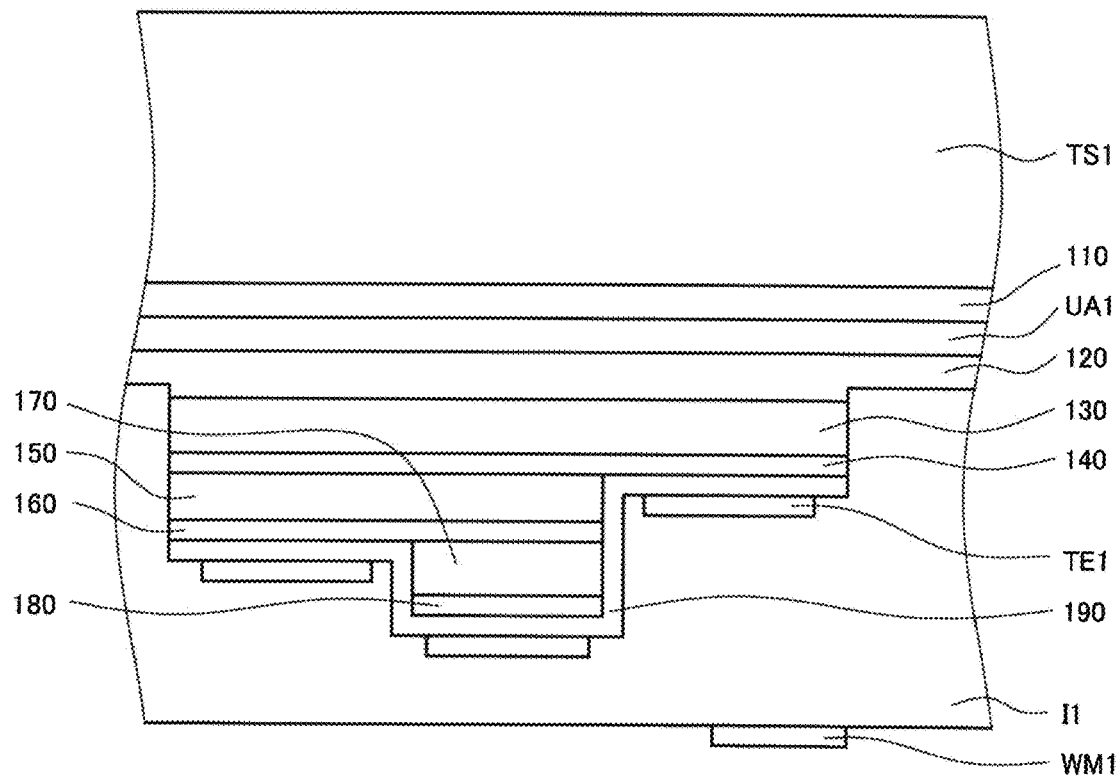
FIG. 11 is a view (part 9) explaining a method for producing the light-emitting device D1 according to the first embodiment.

As shown in FIG. 11, a part of the wavelength conversion layer WM1 is removed to remain only the first light emission region R1. For this, etching is performed using a mask.

4-10. Forming Reflective Layer

Figure 12:
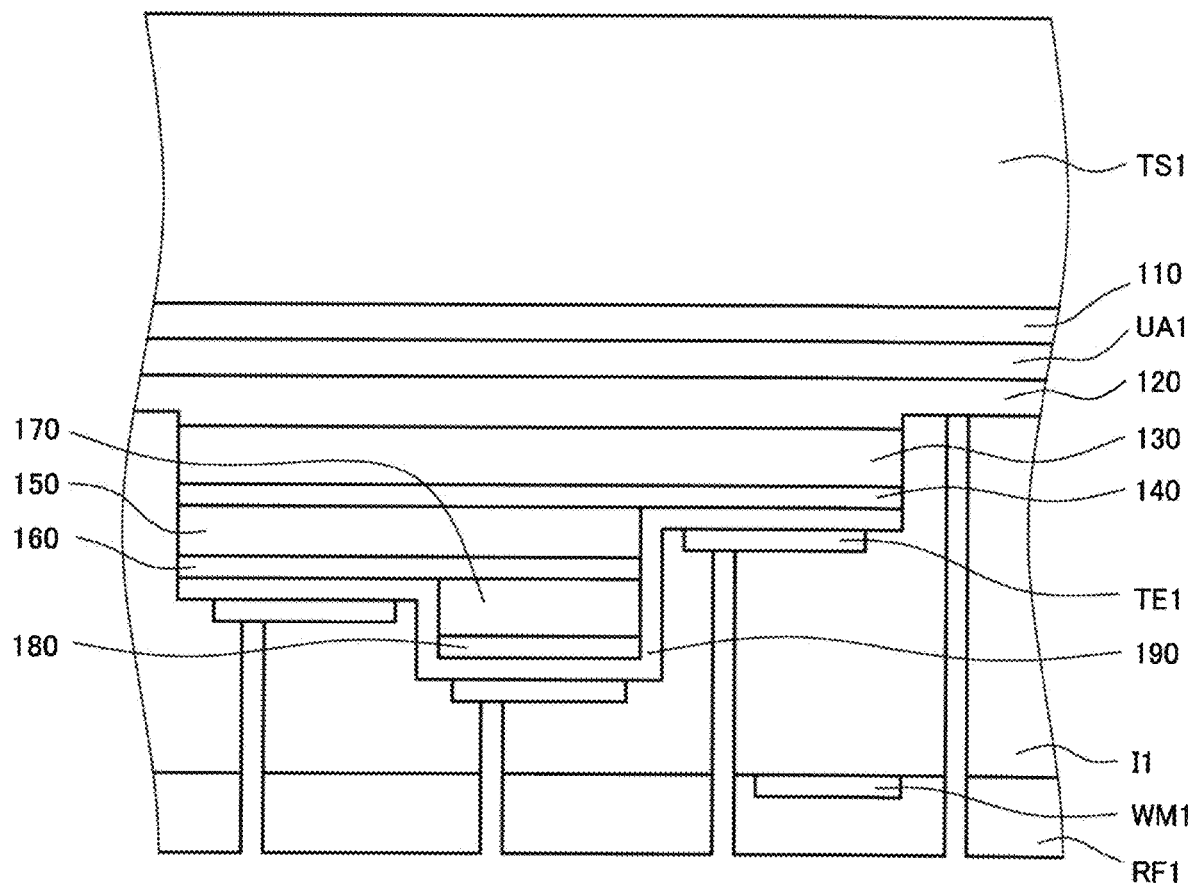
FIG. 12 is a view (part 10) explaining a method for producing the light-emitting device D1 according to the first embodiment.

As shown in FIG. 12, a reflective layer RF1 is formed on the wavelength conversion layer WM1 and the insulating layer I1. Then, recesses are formed as shown in FIG. 12.

4-11. Forming Electrode

Figure 13:
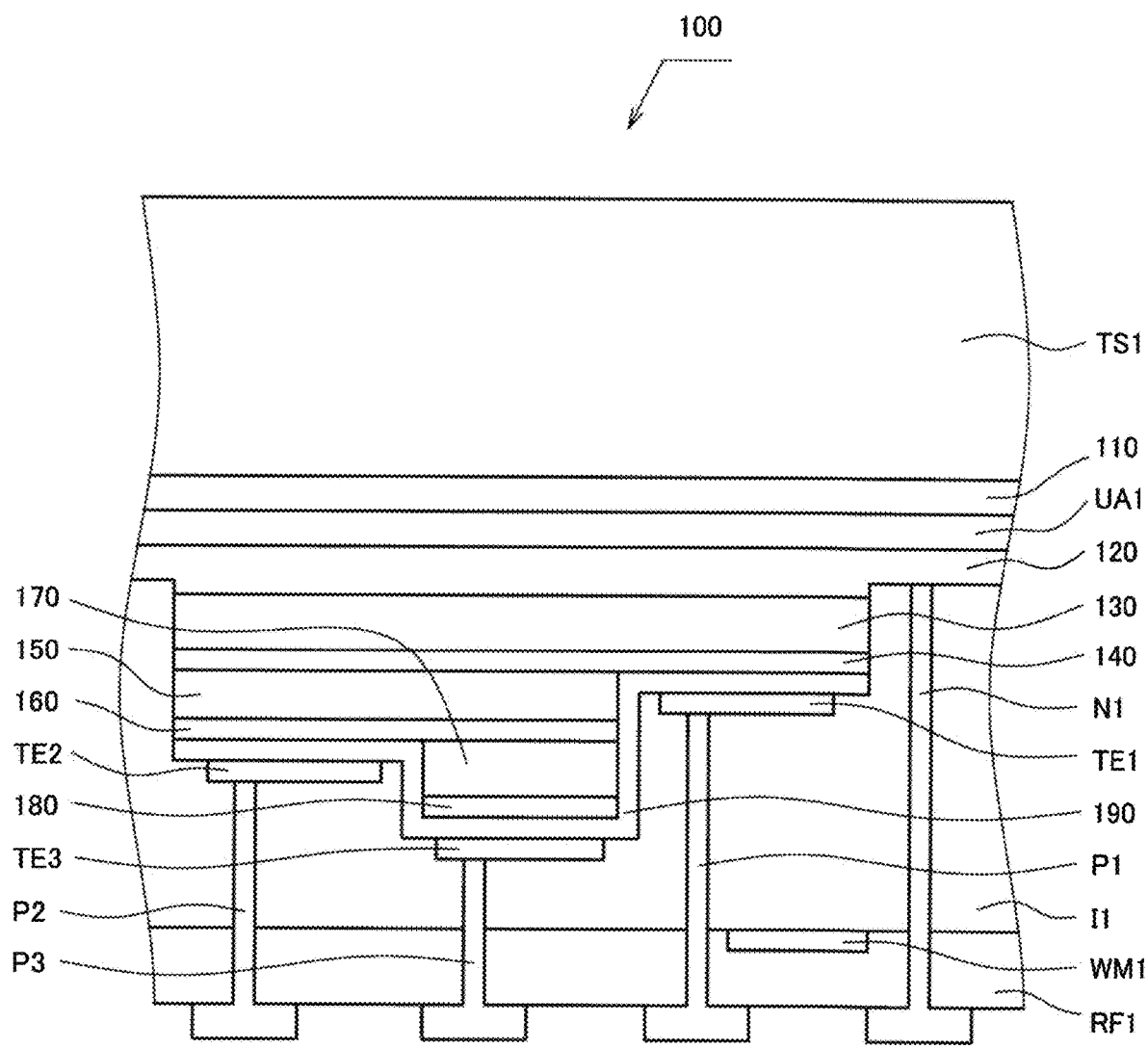
FIG. 13 is a view (part 11) explaining a method for producing the light-emitting device D1 according to the first embodiment.

As shown in FIG. 13, an n-type contact electrode N1, p-type contact electrodes P1, P2, and P3 are formed. The light-emitting device 100 has these electrodes formed.

4-12. Mounting

The light-emitting device 100 is mounted on a driving circuit substrate MB1. For that, soldering may be used.

5. Effect of First Embodiment

The light-emitting device D1 according to the first embodiment includes a first light-emitting layer 130, a second light-emitting layer 150, a third light-emitting layer 170, and a wavelength conversion layer WM1. The first light-emitting layer 130 emits ultraviolet ray, the wavelength conversion layer WM1 converts the ultraviolet ray into red light. Moreover, the second light-emitting layer 150 emits blue light, and the third light-emitting layer 170 emits green light. Thus, the subpixel of the light-emitting device D1 can emit three colors of lights: red, green, and blue. The reflective layer RF1 reflects these lights to the light extraction surface side.

6. Variations 6-1. Wavelength Conversion Layer and p-Electrode

Figure 14:
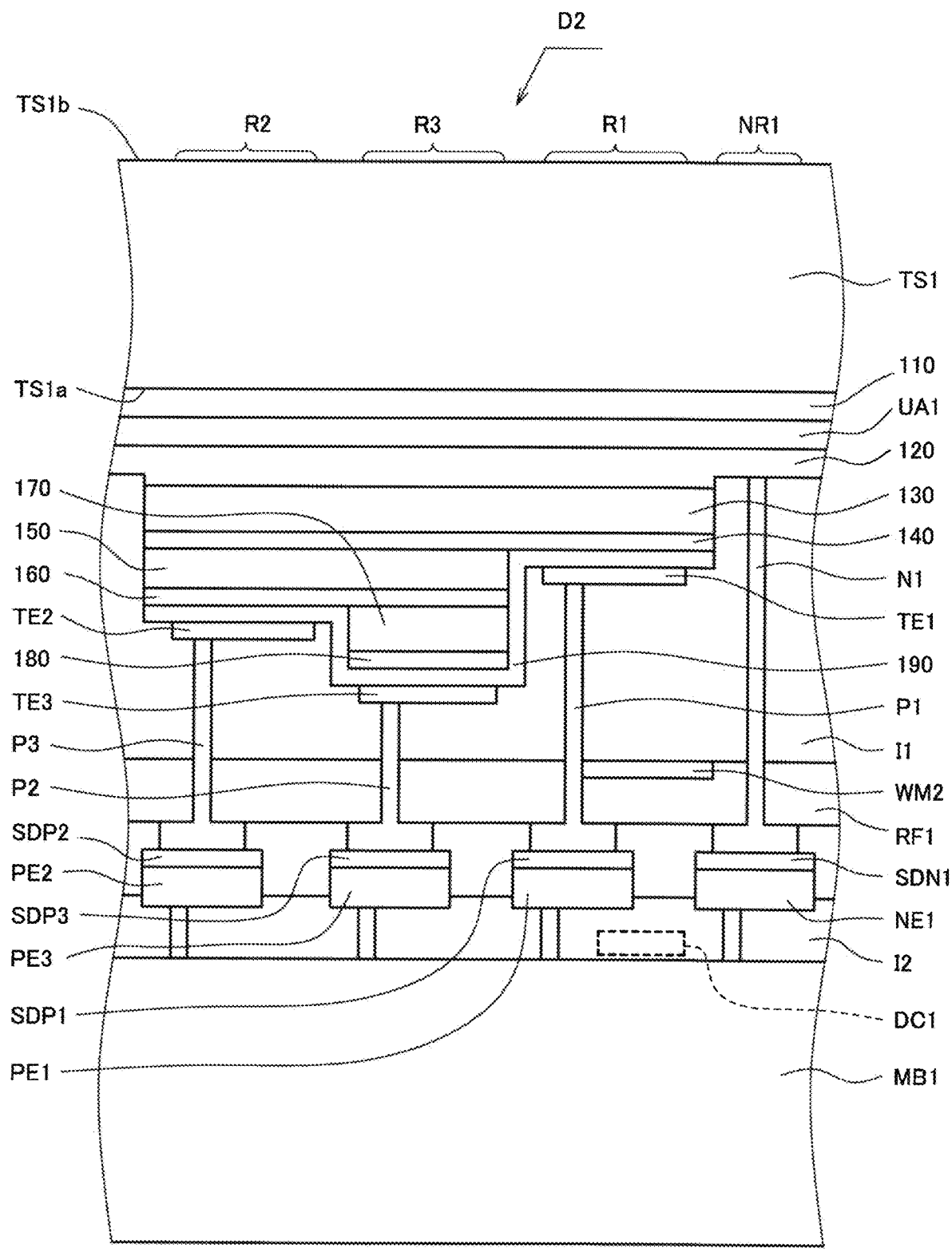
FIG. 14 is a schematic view of the structure of a light-emitting device D2 according to a variation of the first embodiment.

FIG. 14 is a schematic view of the structure of a light-emitting device D2 according to a variation of the first embodiment. As shown in FIG. 14, the light-emitting device D2 includes a wavelength conversion layer WM2. The wavelength conversion layer WM2 is in contact with both the reflective layer RF1 and the insulating layer I1. The wavelength conversion layer WM2 is in contact with the p-type contact electrode P1. The wavelength conversion layer WM2 can convert ultraviolet ray emitted from the first light-emitting layer 130 into red light.

6-2. Position of Wavelength Conversion Layer

Figure 15:
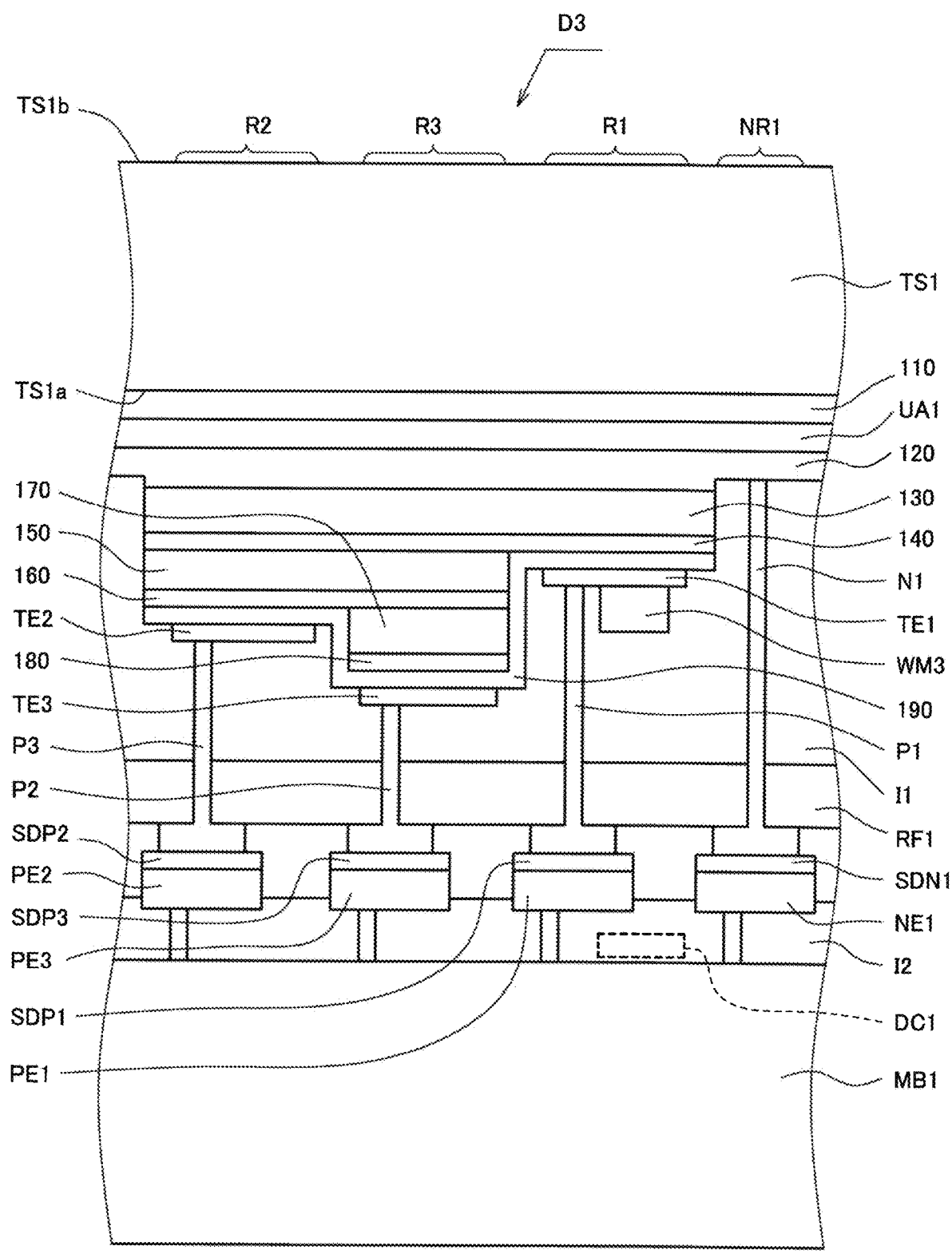
FIG. 15 is a schematic view of the structure of a light-emitting device D3 according to a variation of the first embodiment.

FIG. 15 is a schematic view of the structure of a light-emitting device D3 according to a variation of the first embodiment. As shown in FIG. 15, the light-emitting device D3 has a wavelength conversion layer WM3. The wavelength conversion layer WM3 is formed on and in contact with the transparent electrode TE1. The wavelength conversion layer WM3 is in contact with the insulating layer I1. The wavelength conversion layer WM3 is not in contact with the reflective layer RF1. Even in this case, the wavelength conversion layer WM3 can convert ultraviolet ray emitted from the first light-emitting layer 130 into red light. The thickness of the transparent electrode TE1 may be increased.

6-3. Light-Absorbing Layer

Figure 16:
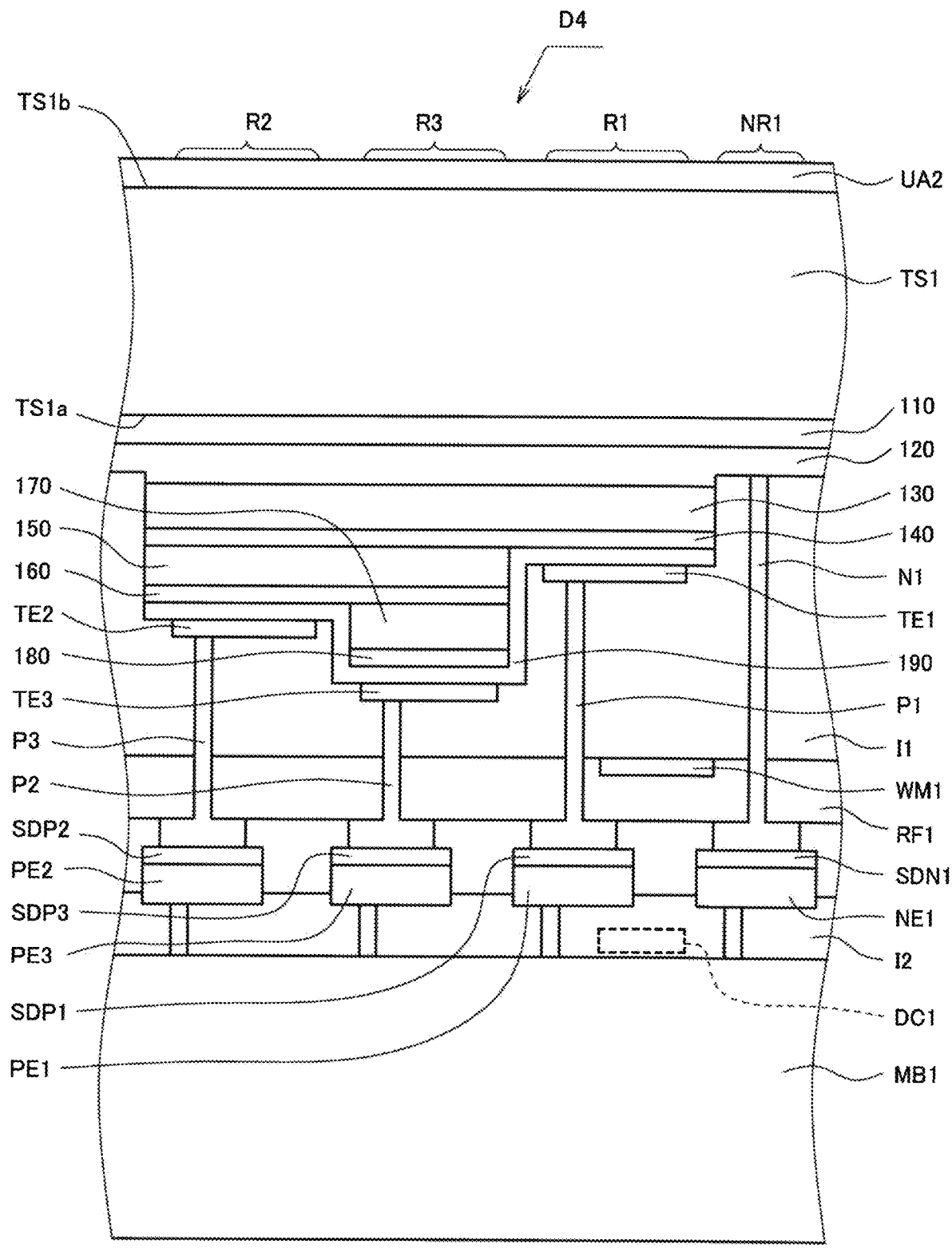
FIG. 16 is a schematic view of the structure of a light-emitting device D4 according to a variation of the first embodiment.

FIG. 16 is a schematic view of the structure of a light-emitting device D4 according to a variation of the first embodiment. As shown in FIG. 16, the light-emitting device D4 has a light-absorbing layer UA2. The light-absorbing layer UA2 is formed on the second surface TS1b of the transparent substrate TS1. That is, the light-absorbing layer UA2 is formed on the second surface TS1b side of the transparent substrate TS1. The light-absorbing layer UA2 absorbs ultraviolet ray. The light-absorbing layer UA2 may be made of Group II nitride semiconductor or a material other than Group II nitride semiconductor. Even in this case, the light-absorbing layer UA2 suppresses ultraviolet ray from being emitted to the outside of the light-emitting device D4. The light-emitting device D4 has a light extraction surface on the second surface TS1b side of the transparent substrate TS1.

6-4. Composition

A barrier layer of the first light-emitting layer 130, the second light-emitting layer 150, the third light-emitting layer 170 may be an AlInGaN layer other than GaN layer.

6-5. Combinations

The aforementioned variations may be combined with one another without any restriction.

A specific embodiment of the invention regarding micro-LED display will next be described with reference to the drawings. However, the present invention is not limited to the embodiment.

Second Embodiment

Figure 17:
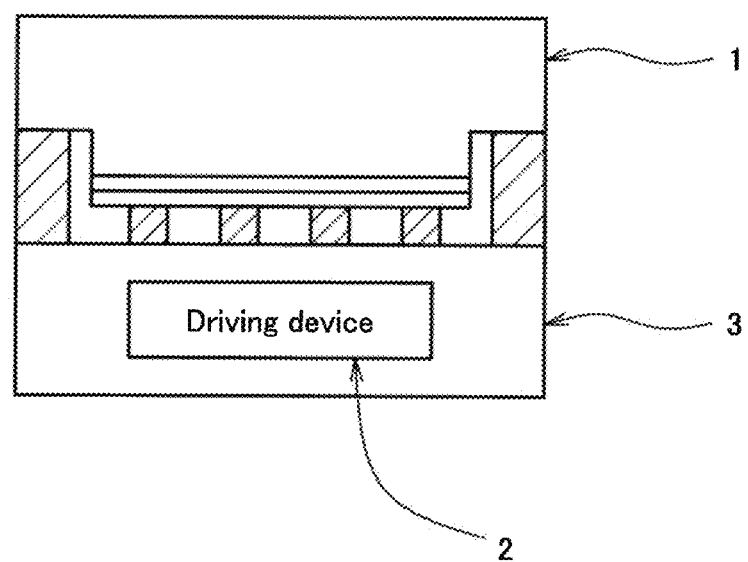
FIG. 17 is a view of the structure of a micro-LED display according to a second embodiment.

FIG. 17 is a view of the structure of a micro-LED display according to a second embodiment. As shown in FIG. 17, the micro-LED display according to the second embodiment comprises a monolithic micro-LED element 1 and a driving device 2.

(Structure of Micro-LED Display Element 1)

Figure 18A:
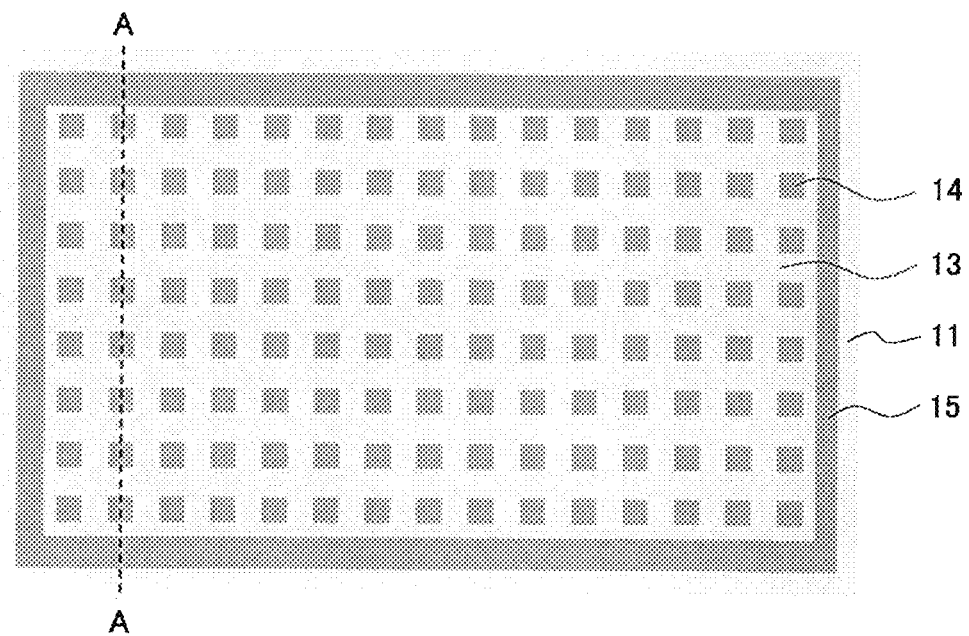
FIGS. 18A and 18B are a view of the structure of a micro-LED display element 1.
Figure 18B:
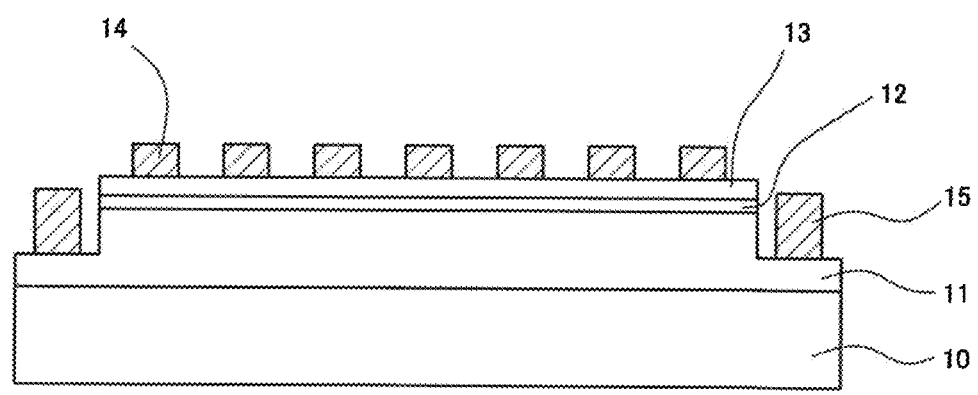

Firstly, the structure of the micro-LED display element 1 is described. FIGS. 18A and 18B are a view of the structure of a micro-LED element 1. FIG. 18A is a top view, and FIG. 18B is a cross sectional view of A-A in FIG. 18A.

The micro-LED display element 1 is a monolithic Group III nitride semiconductor light-emitting element in which a plurality of light-emitting parts is arranged in a matrix on one element. As shown in FIG. 18B, the micro-LED display element 1 includes a substrate 10, an n-type layer 11, a light-emitting layer 12, a p-type layer 13, a p-electrode 14, and an n-electrode 15. The micro-LED display element 1 is a single-color display, and one pixel is composed of one subpixel. The micro-LED display element 1 is a flip-chip type element which extracts light from the backside of the substrate 10, and is mounted face down on a mounting substrate 3.

Next will be described components of the micro-LED display element 1.

The substrate 10 is a growth substrate for growing Group III nitride semiconductor, for example, made of sapphire, GaN, or SiC.

The n-type layer 11 is an n-type semiconductor layer formed on the substrate 10. The light-emitting layer 12 is a semiconductor layer formed on the n-type layer 11, and a layer having a MQW structure or a SQW structure. For example, a blue light emitting layer in which an AlGaN barrier layer and an INGaN well layer are alternately deposited. The p-type layer 13 is a p-type semiconductor layer formed on the light-emitting layer 12.

A plurality of the p-electrodes 14 is arranged in a matrix pattern on the p-type layer 13. Each of the light-emitting layer 12 just below the region where the p-electrodes 14 are arranged, emits light which becomes one pixel. In other words, the p-electrode 14 is arranged for each pixel. The p-electrode 14 is made of, for example, ITO, IZO, or Ag.

The n-electrode 15 has a rectangular ring pattern along the outer circumference of the micro-LED display element 1. A trench reaching the n-type layer 11 is formed by etching on the outer circumference of the micro-LED display element 1, and an n-electrode 15 is formed on the n-type layer 11 exposed in the bottom surface of the trench. One n-electrode is commonly used among pixels. The n-electrode 15 is made of, for example, a layered structure such as Ti/Al.

The micro-LED display element 1 does not have a trench to separate pixels, and the n-electrode 14 is commonly used among pixels. Therefore, the micro-LED display element 1 can be miniaturized.

(Structure of Driving Device 2)

Figure 19A:
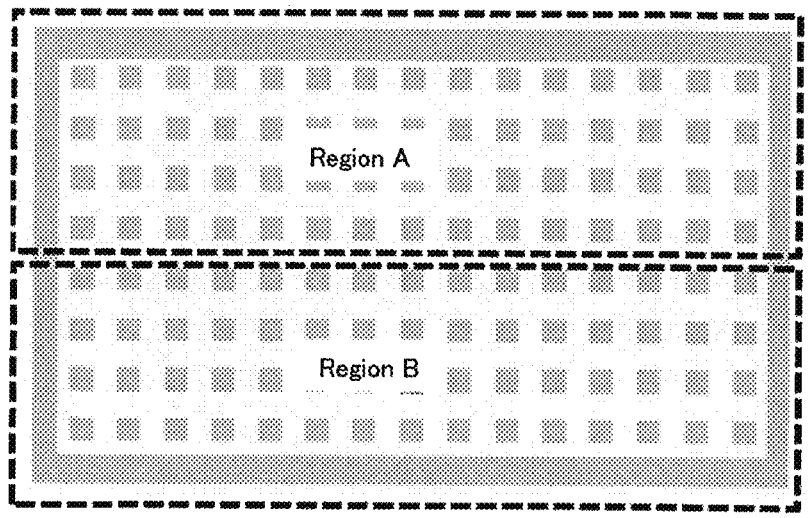
FIGS. 19A and 19B are a view of the structure of a driving device 2.
Figure 19B:
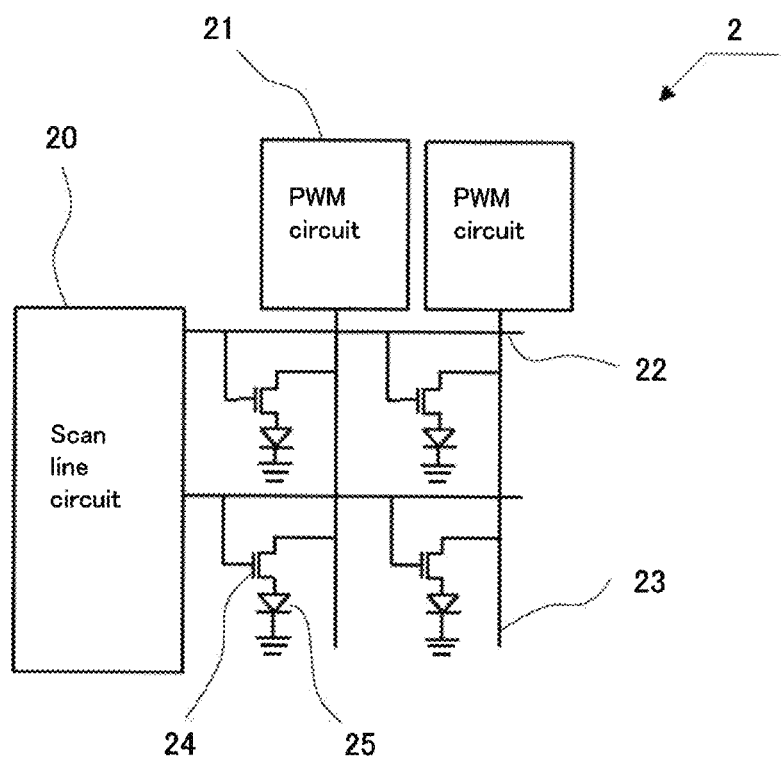

FIG. 19A shows the division of the region of the micro-LED display, and FIG. 19B shows a circuit diagram of a driving device 2.

As shown in FIG. 19A, pixels of the micro-LED display are divided into a plurality of regions, and a driving device 2 is formed for each region. Each region is independently driven by the driving device 2. The region may be divided in any way, for example, the region is preferably divided as follows. In the line direction, the region is divided so that the number of lines of the region is 10 to 100, and the region is not divided in the row direction. Needless to say, the region may be divided in the row direction. For ease of explanation, the region is divided into the regions A and B, that is, two in the line direction.

The driving device 2 includes a scan line circuit 20, a PWM circuit 21, a scan line 22, a data line 23, and a transistor 24. In the circuit diagram of FIG. 19B, pixel of the micro-LED display is indicated as LED25. A scan line circuit 20 or a PWM circuit 21 is realized as an LSI element, and mounted on a mounting substrate 3. The driving device 2, especially, the scan line circuit 20 or the PWM circuit 21 may be mounted below the micro-LED display element 1. The area of the whole micro-LED display can be reduced, thereby miniaturizing the micro-LED display.

The scan line circuit 20 is a circuit sequentially selecting and electrically connecting one of the scan lines 22 formed for each line of the micro-LED display.

The PWM circuit 21 is formed for each row of the micro-LED display, and the data line 23 is connected thereto. The PWM circuit 21 is a circuit modulating the current flowing to the LED25, and a circuit controlling the brightness of the LED25 according to the duty ratio. Through PWM control, the brightness can be controlled without causing a shift in the emission wavelength of the LED25.

In this way, the PWM circuit 21 is formed for each row, and the number of the circuits can be reduced more than when the PWM circuit 21 is formed for each LED25. Thereby, the micro-LED display can be miniaturized.

The scan line 22 is formed for each line of the micro-LED display. The scan line 22 is connected in parallel to a gate of the transistor 24 in the corresponding line.

The data line 23 is formed for each row of the micro-LED display. The data line 23 is connected in parallel to a drain of the transistor 24 in the corresponding row.

The transistor 24 is formed for each pixel. A gate of the transistor 24 is connected to the scan line 22, a drain of the transistor 24 is connected to the data line 23, and a source of the transistor 24 is connected to an anode (p-electrode 14) of the LED25. The ON/OFF of the transistor 24 is controlled by applying a voltage to the gate. When the transistor 24 is ON, the line is connected and a current flows to the LED25, and when the transistor 24 is OFF, the line is disconnected, and a current does not flow to the LED25.

Next will be described driving of the micro-LED display by the driving device 2.

When a signal for displaying the micro-LED display is input, light emission of each pixel (LED25) is independently controlled by the driving device 2 in each of the regions A and B.

In the region A, the line to be light emitted by the scan line circuit 20 is sequentially scanned. That is, one scan line 22 is selected and electrically connected, and a voltage is applied to a gate of a plurality of transistors 24 connected to that scan line 22. For example, scanning is sequentially performed from the top line to the bottom line in the region A. Thereby, the transistor 24 of the line selected by the scan line circuit 20 is turned on, allowing a current to flow.

In the row direction, the duty ratio of the current flowing to the LED25 is controlled by the PWM circuit 21, and the light emission intensity of the LED25 of each row is controlled. The LED25 of the line not selected by the scan line circuit 20 does not emit light because the transistor 24 is off.

Similarly in the region B, the line to be light emitted is sequentially scanned by the scan line circuit 20, and the light emission intensity of the LED25 of each row is controlled by the PWM circuit 21. In this way, light emission of each pixel in the regions A and B is controlled. As a result, light emission of each pixel of the entire micro-LED display is controlled.

In the regions A and B, the LED 25 emits light one line by one line, and the light emission time for each line is reduced. However, since the number of scans is reduced by dividing the display region into the regions A and B, the light emission time can be longer than when the entire display region is scanned. Moreover, the light emission intensify of each LED 25 can be controlled so as to be sufficiently bright by the PWM circuit 21. Therefore, a problem in the case of passive matrix method does not occur, and the number of pixels can be increased.

The micro-LED display according to the second embodiment can suppress the reduction of the light emission time for each line because the micro-LED display is driven by dividing the display region into a plurality of regions. Therefore, the number of pixels can be increased.

In the micro-LED element 1, an n-electrode 15 can be commonly used without being formed for each subpixel. There is no need to separate subpixels, and the n-type layer 11 does not need to be separated into each subpixel. The PWM circuit 21 is formed for each row, thereby suppressing the increase in circuit scale. Therefore, the micro-LED display can be miniaturized.

Thus, the second embodiment has a method appropriate for driving the monolithic micro-LED display.

The micro-LED display according to the second embodiment is a single-color display. However, needless to say, it is applicable to a full-color display. In that case, the micro-LED display may have a structure having blue, green, and red light emitting layers, a structure having a blue and green light-emitting layers and converting blue light into red light, or a structure having an ultraviolet light-emitting layer and converting ultraviolet ray into blue, green, and red lights.

In the second embodiment, the transistor 24 of the driving circuit 2 is mounted on the mounting substrate 3. However, it is monolithically manufactured in the micro-LED display element 1.

What is claimed is:

1. A light-emitting device including: a driving circuit substrate; a transparent substrate; a semiconductor layer between the driving circuit substrate and the transparent substrate; a first light emission region, a second light emission region, a third light emission region; and a wavelength conversion layer, wherein the transparent substrate has a first surface and a second surface opposite to the first surface; the first surface of the transparent substrate faces the semiconductor layer; a light extraction surface is on the second surface side of the transparent substrate; the semiconductor layer has an n-type semiconductor layer, a first light-emitting layer, a first intermediate layer, a second light-emitting layer, a second intermediate layer, a third light-emitting layer, and a p-type semiconductor layer; the first light emission region has the n-type semiconductor layer, the first light-emitting layer, the p-type semiconductor layer, and the wavelength conversion layer, the second light emission region has the n-type semiconductor layer, the first light-emitting layer, the first intermediate layer, the second light-emitting layer, and the p-type semiconductor layer, the third light emission region has the n-type semiconductor layer, the first light-emitting layer, the first intermediate layer, the second light-emitting layer, the second intermediate layer, the third light-emitting layer, and the p-type semiconductor layer; a band gap of a well layer of the third light-emitting layer is smaller than a band gap of a well layer of the second light-emitting layer; a band gap of a well layer of the second light-emitting layer is smaller than a band gap of a well layer of the first light-emitting layer; and the wavelength conversion layer is disposed between the p-type semiconductor layer of the first light emission region and the driving circuit substrate.

2. In the light-emitting device according to claim 1, wherein the wavelength conversion layer is not disposed between the p-type semiconductor layer of the second light emission region and the driving circuit substrate, and between the p-type semiconductor layer of the third light emission region and the driving circuit substrate.

3. In the light-emitting device according to claim 1, wherein a transparent electrode is formed in contact with the p-type semiconductor layer, and the wavelength conversion layer is in contact with the transparent electrode of the first light emission region.

4. The light-emitting device according to claim 1, wherein a transparent electrode is formed in contact with the p-type semiconductor layer, a p-type contact electrode is formed in contact with the transparent electrode, and the wavelength conversion layer is in contact with the p-type contact electrode of the first light emission region.

5. The light-emitting device according to claim 1, wherein a light-absorbing layer absorbing light having a wavelength corresponding to the emission wavelength of the first light-emitting layer is formed between the n-type semiconductor layer and the transparent substrate.

6. The light-emitting device according to claim 5, wherein the light-absorbing layer is formed over the first light emission region, the second light emission region, and third light emission region.

7. The light-emitting device according to claim 5, wherein the light-absorbing layer is semiconductor.

8. The light-emitting device according to claim 1, wherein a light-absorbing layer absorbing light having a wavelength corresponding to the emission wavelength of the first light-emitting layer is formed on the second surface side of the transparent substrate.

9. The light-emitting device according to claim 1, wherein the wavelength conversion layer converts ultraviolet light into red light.

10. The light-emitting device according to claim 1, wherein the wavelength conversion layer is semiconductor.

11. The light-emitting device according to claim 1, wherein a reflective layer is formed between the wavelength conversion layer and the driving circuit substrate.

12. A micro-LED display having a monolithic micro-LED display element in which a plurality of light-emitting parts is arranged in a matrix, and a driving device driving the micro-LED display element, wherein the light-emitting part is divided into a plurality of regions, and each region is independently driven by the driving device, the driving device comprising:

a scan line circuit sequentially selecting and scanning one line by one line being light emitted of the light-emitting part in each region;

a transistor provided for each light-emitting part to control so that the line selected by the scan line circuit is turned on to flow a current to the light emitting part, and the line not selected by the scan line circuit is turned off to prevent a current from flowing to the light emitting part; and a PWM circuit provided for each raw of the light emitting part in each region to control the duty ratio by pulse modulating the current flowing to the light emitting part.

13. The micro-LED display according to claim 12, wherein the micro-LED display element has a p-electrode formed for each light-emitting part, and an n-electrode commonly formed among the light-emitting parts.

14. The micro-LED display according to claim 13, wherein each region is divided so that the number of lines is 10 to 100.

15. The micro-LED display according to claim 1, wherein the micro-LED display element and the driving device are mounted on a mounting substrate, and the driving device is mounted below the micro-LED display element.

* * * * *